United States Patent [19]
Choi

[11] Patent Number: 5,955,245
[45] Date of Patent: Sep. 21, 1999

[54] METHOD OF FORMING POLYIMIDE PATTERNS ON SUBSTRATES

[75] Inventor: Jin-O Choi, Amherst, N.Y.

[73] Assignee: Occidental Chemical Corporation, Niagara Falls, N.Y.

[21] Appl. No.: 08/134,707

[22] Filed: Oct. 12, 1993

[51] Int. Cl.$^6$ ................................................ G03C 5/00
[52] U.S. Cl. .................. 430/326; 430/270.1; 430/192; 430/176; 427/510; 427/520
[58] Field of Search ................................... 430/326, 270, 430/192, 176; 427/510, 520

[56] References Cited

U.S. PATENT DOCUMENTS

| | | | |
|---|---|---|---|
| 4,073,788 | 2/1978 | Peterson | 427/120 |
| 4,369,090 | 1/1983 | Wilson et al. | 430/317 |
| 4,829,131 | 5/1989 | Lee | 525/426 |

FOREIGN PATENT DOCUMENTS

| | | |
|---|---|---|
| 0224680 | 6/1987 | European Pat. Off. . |
| 0349010 | 1/1990 | European Pat. Off. . |
| 01113434 | of 0000 | Japan . |
| 03157427 | of 0000 | Japan . |
| 03197530 | of 0000 | Japan . |

OTHER PUBLICATIONS

Rhee et al., "Synthesis of Alternating Aromatic Copolyimides", Macromolecules, vol. 26, No. 2, Jan. 18, 1993, pp. 404–406.

Article: "Wet Etch Patterning of Polyimide Siloxane For Electronic Applications" G. C. Davis and C. L. Fasoldt, Proceedings of Second International Conf. on Polyimides: Synthesis, Characterization and Application, Ellenville, NY (1985), pp. 381–388.

Article: "Patternable Silicone Polyimide Copolymers", D. A. Bolan et al, Polyimides: Mater. Chem. Chacter., Proc. Tech. Conf. Polyimides, 3rd, Elsevier, Amsterdam (1989), pp. 103–114.

Article: "Etching of Partially Cured Polyimide", C. E. Diener and J. R. Susko, Polyimides: Synth. Character. Appl., Proc. Tech. Conf. Polyimides, 1st, (1982) edited by K. L. Mittal, vol. 1, Plenum, New York, (1984), pp. 353–364.

*Primary Examiner*—Maria Nuzzolillo
*Assistant Examiner*—Laura Weiner
*Attorney, Agent, or Firm*—Richard D. Fuerle

[57] ABSTRACT

Disclosed is a method of forming a pattern on a substrate. A first solution is formed of an organic solvent and monomers of diamine and dianhydride. The monomers are polymerized to form a polyamic acid soluble in the organic solvent. About 20 to about 95% of the amic acid groups in the polyamic acid are imidized to form a partially imidized polyamic acid. A more concentrated solution of the partially imidized polyamic acid is formed. This can be accomplished by precipitating the partially imidized polyamic acid from the first solution and dissolving it in a second organic solvent to form a second solution. The second solution is applied to the substrate and the solvent is evaporated to form a coating of the partially imidized polyamic acid on the substrate. A portion of the coating is removed to form a pattern on the substrate and the remaining partially imidized polyamic acid is fully imidized on the substrate.

20 Claims, 1 Drawing Sheet

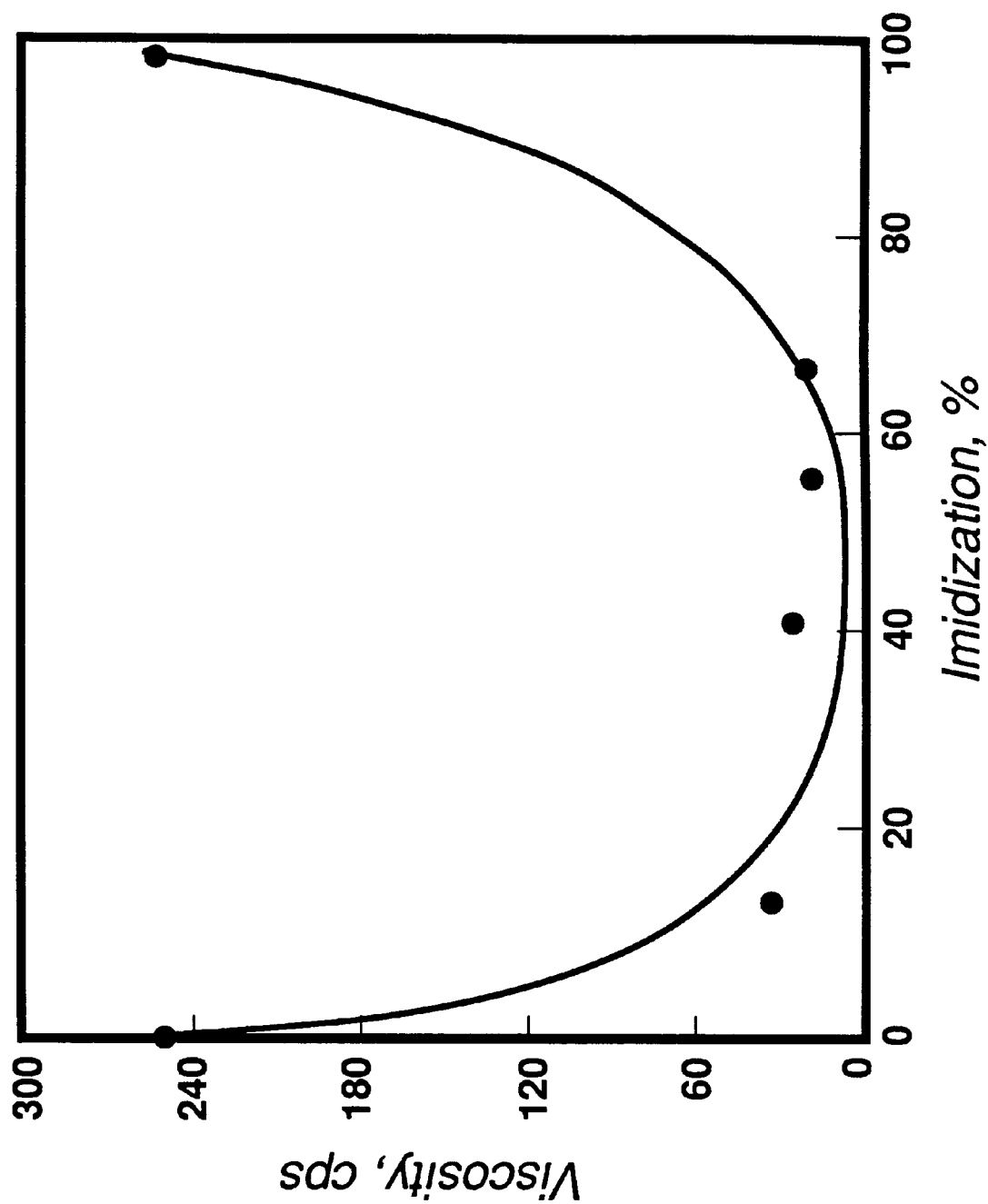

METHOD OF FORMING POLYIMIDE PATTERNS ON SUBSTRATES

BACKGROUND OF THE INVENTION

This invention relates to a novel method of forming a pattern on a substrate. In particular, it relates to the use of a high solids content solution of a partially imidized polyamic acid to coat and form a pattern on the substrate.

Because of their excellent thermal, insulation, and adhesion properties polyimides have been used as passivation, buffer or dielectric layer coatings in semiconductor fabrication. To open vias for connecting conductive wires underneath polyimide coatings, two patterning methods have been developed. In one method (see U.S. Pat. No. 4,369,090), a solution of a polyamic acid is prepared by dissolving a diamine and a dianhydride in an organic solvent. The solution is applied to the substrate and is heated to evaporate the solvent and partially imidize the polyamic acid. Partial imidization is necessary to reduce swelling of the coating during the patterning process and thereby form a better pattern by reducing shrinkage during imidization. However, the polyamic acid cannot be fully imidized on the substrate because the resulting polyimide would be insoluble and portions of it could not be dissolved to form a pattern. A photoresist is applied over the partially imidized polyamic acid coating and it is exposed to a pattern of light. Those portions of the photoresist that were exposed to the light (or that were not exposed to the light) are soluble in a solvent and are washed away along with the partially imidized polyamic acid underneath. The remaining boating is heated to fully imidize the polyamic acid.

In another method of forming patterns of a polyimide coating on a substrate (see U.S. Pat. No. 4,880,722) the solution of the polyamic acid is mixed with a photosensitizer. The solution is applied to the substrate and is heated to evaporate the solvent and partially imidize the polyamic acid. The coating is exposed to a pattern of UV light which renders those portions of the photosensitizer that were exposed to the light soluble in an aqueous base developer. The insoluble photosensitizer is hydrophobic and prevents the polyamic acid with which it is in contact from dissolving in an aqueous base developer. The soluble portions of the coating and the underlying partially imidized polyamic acid are washed away with an aqueous base developer. The remaining coating is heated to fully imidize the polyamic acid. While this method works well, the photosensitizer may decompose during the partial imidization step.

In both methods, it is difficult to obtain low shrinkage coatings due to the partial imidization of the polyamic acid. In some applications coatings with less shrinkage are needed for thick insulation or protection of the substrate.

SUMMARY OF THE INVENTION

I have discovered that when a polyamic acid is partially imidized it becomes more soluble in organic solvents. That is, as the percent of imidization increases from zero, the viscosity of the partially imidized polyamic acid decreases to a minimum and then increases again near 100% imidization. As a result of this unusual phenomenon, I have found that it is possible to form solutions of higher solids content by partially imidizing the polyamic acid. Because the solutions have a higher solids content, I am able to obtain less shrinkable coatings on substrates. Thus, while in the prior art, solutions of polyamic acid were applied to substrates and then partially imidized on the substrates, in the method of this invention the solutions of polyamic acids are partially imidized before they are applied to the substrate.

In order to obtain a high solids content solutions I preferably recover the partially imidized polyamic acid from the solution in which it was prepared and redissolve it in an organic solvent. Once this second solution has been formed, it can be applied to the substrate, dried and covered with a photoresist or a photosensitizer can be added to it before it is applied to the substrate. In this way, I am able to obtain less shrinkable coatings in a single pass than was possible by the prior art methods.

BRIEF DESCRIPTION OF THE DRAWING

The accompanying drawing is a graph showing the relationship between percent imidization of a polyamic acid and its viscosity.

DESCRIPTION OF THE PREFERRED EMBODIMENTS

In the first step of the process of this invention, a first solution is prepared of monomers in an organic solvent. This first solution should be about 5 to about 20 weight percent solids. Suitable organic solvents include N-methylpyrrolidone (NRP) e dimethylacetamide (DHAC), 2-vinyl pyrrolidone, acetone, benzene, toluene, xylene, "Cellosolve" or glycol ethyl ether, "Cellosolve acetate" or hydroxyethyl acetate glycol monoacetatee diethyl ether or dichloromethane, dimethyl formamide (DMF), ethyl alcohol, methyl isobutyl ketone, methyl ethyl ketone, sulfolane, dimethyl sulfoxide (DMSO) hexamethylphosphoramide (HHPA)a tetramethyl urea (TMU)e diethyleneglycol diethyl ether, 1,2-dimethoxyethane or monoglyme, diethylene glycol dimethyl ether or bis(2-methoxyethyl) ether or diglyme, 1,2-bis(2-methoxyethoxy ethane or triglymee bis [2-(2-methoxyethoxy) ethyl)] ether or tetraglyme, tetrahydrofuran, m-dioxanea and p-dioxane. NMP and DNAC are preferred as they are good solvents for polyamic acids.

Dianhydride and diamine monomers are used to form the polyamic acid. In this invention, these monomers do not contain photosensitive groups.

DIANHYDRIDE

Any dianhydride or combination of dianhydrides can be used as the dianhydride monomer in forming the polyimide, although aromatic dianhydrides are preferred as they give superior properties. Examples of suitable dianhydrides include 1,2,5,6-naphthalene tetracarboxylic dianhydride;

1,4,5,8-naphthalene tetracarboxylic dianhdyridee 2,3,6,7-naphthalene tetracarboxylic dianhydridee 2-(3',4'-dicarboxyphenyl) 5,6-dicarboxybenzimidazole dianhydride;

2-(3',4'-dicarboxyphenyl) 5,6-dicarboxybenzoxazole dianhydride;

2-(3',4'-dicarboxyphenyl) 5,6-dicarboxybenzothiazole dianhydride;

2,2'3,3'-benzophenone tetracarboxylic dianhydride;

2,3,3',4'-benzophenone tetracarboxylic dianhydride;

3,3',4,4'-benzophenone tetracarboxylic dianhydride (BTDA);

2,2',3,3'-biphenyl tetracarboxylic dianhydride, 2,3,3',4'-biphenyl tetracarboxylic dianhydride;

3,3'4,4'-biphenyl tetracarboxylic dianhydride (BPDA);

bicyclo-[2,2,2]-octen-(7)-2,3,5,6-tetracarboxylic-2,3,5,6-dianhydride;

thio-diphthalic anhydride;
bis (3,4-dicarboxyphenyl) sulfone dianhydride;
bis (3,4-dicarboxyphenyl) sulfoxide dianhydride;
bis (3,4-dicarboxyphenyl oxadiazole-1,3,4) paraphenylene dianhydride;
bis (3,4-dicarboxyphenyl) 2,5-oxadiazole 1,3,4-dianhydride;
bis 2,5-(3',4'-dicarboxydiphenylether) 1,3,4-oxadiazole dianhydride;
bis (3,4-dicarboxyphenyl) ether dianhydride or 4,4' oxydiphthalic anhydride (ODPA);
bis (3,4-dicarboxyphenyl) thioether dianhydride;
bisphenol A dianhydride;
bisphenol S dianhydride;
2,2bis (3,4-dicarboxyphenyl) hexafluoropropane dianhydride or 5,5-[2,2,2-trifluoro-1-(trifluoromethyl) ethylidene] bis-1,3-isobenzofurandione) (6FDA);
hydroquinone bisether dianhydride;
bis (3,4-dicarboxyphenyl) methane dianhydride;
cyclopentadienyl tetracarboxylic acid dianhydride;
cyclopentane tetracarboxylic dianhydride;
ethylene tetracarboxylic acid dianhdyride;
perylene 3,4,9,10-tetracarboxylic dianhydride;
pyromellitic dianhydride (PMDA);
tetrahydrofuran tetracarboxylic dianhydride; and
resorcinol dianhydride.

The preferred dianhydrides are ODPA, BPDA, BTDA, 6FDA, and PHDA or mixtures thereof, as these dianhydrides are readily available and have been found to give superior properties. The dianhydrides can be used in their tetraacid form or as mono, di, tri, or tetra esters of the tetra acid, but the dianhydride form is preferred because it is more reactive.

DIAMINE

If a polyimide is to be prepared, the diamine monomer does not contain siloxane. The non-siloxane containing diamine should be aromatic as those diamines give the best properties. Examples of suitable diamines include m- and p-phenylenediamine;
2,4-diaminotoluene (TDA);
2,5- and 2,6-diaminotoluene;
p- and m-xylenediamine;
4,4'-diaminobiphenyl;
4,4'-diaminodiphenyl ether or 4,4'-oxydianiline (ODA);
3,4'-oxydianiline;
4 4'-diaminobenzophenone;
3,3',3,4', or 4,4'-diaminophenyl sulfone or m,m-, m,p- or p,p- sulfone dianiline;
4,4'-diaminodiphenyl sulfide;
3,3'or 4,4'-diaminodiphenylmethane or m,m- or p,p-methylene dianiline;
3,3'-dimethylbenzidine;
α,α'-bis(4-aminophenyl)-1,4-diisopropyl benzene or 4,4'-isopropylidenedianiline or bisaniline p;
α,α'-bis(4-aminophenyl)-1,3-diisopropyl benzene or 3,3'-isopropylidonedianiline or bisaniline m;
1,4-bis(p-aminophenoxy)benzene;
1,3-bis(p-aminophenoxy)benzene;
4,4'-bis (4-aminophenoxy)biphenyl;
1,3-bis(3-aminophenoxy)benzene (APB);
2,4-diamine-5-chlorotoluene;
2,4diamine-6-chlorotoluene;
2,2-bis(4[4-aminophenoxy]phenyl)propane (BAPP);
trifluoromethyl-2,4-diaminobenzene;
trifluoromethyl-3,5diaminobenzene;
2,2'-bis(4-aminophenyl)-hexafluoropropane (6F diamine);
2,2'-bis(4-phenoxy aniline) isopropylidene;
2,4,6trimethyl-1,3-diaminobenzene;
4,4'-diamino-2,2'-trifluoromethyl diphenyloxide;
3,3'-diamino-5,5'-trifluoromethyl diphenyloxide;
4,4'-trifluoromethyl-2,2'-diaminobiphenyl;
2,4,6-trimethyl-1,3-diaminobenzene; diaminoanthraquinone;
4,4'-oxybis[2-trifluoromethyl)benzeneamine] (1,2,4-OBABTF);
4,4'-oxybis[3-trifluoromethyl)benzeneamine];
4,4'-thiobis[(2-trifluoromethyl)benzeneamine];
4,4'-thiobis[(3-trifluoromethyl)benzeneamine];
4,4'-sulfoxylbis[(2-trifluoromethyl)benzeneamine];
4,4'-sulfoxylbis[(3-trifluoromethyl)benzeneamine);
4,4'-ketobis[(2-trifluoromethyl)benzeneamine];
4,4'-{(2,2,2-trifluoromethyl-1-(trifluoromethyl)-ethylidine)bis(3-trifluoromethyl)benzeneamine].

The preferred aromatic diamines are ODA, TDA, APB and BAPP, or a combination of these, due to their excellent properties.

SILOXANE MONOMER

It is preferable to prepare a polyimidesiloxane by using as part of the monomer about 1 to about 60 weight percent, based on total monomer weight, of a monomer that contains siloxane. The siloxanecontaining monomers can be either aromatic or non-aromatic, but non-aromatic monomers are preferred as they are more readily available. The siloxane-containing monomer is preferably a diaminse but it could also be a dianhydride. Examples of siloxane diamines that can be used include compounds having the formula

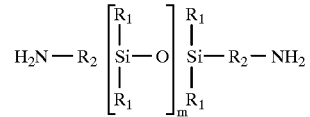

Examples of siloxans dianhydrides that can be used include compounds having the formula

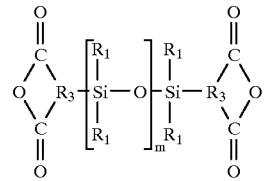

where $R_1$, $R_2$, and $R_3$ are mono, di and triradicals, respectively each independently selected from a substituted or unsubstituted 1 to 12 carbon atom aliphatic group or a substituted or unsubstituted 6 to 10 carbon atom aromatic group. Examples of monoradicals include —$CH_3$, —$CF_3$, —$CH=CH_2$, —$(CH_2)_nCF_3$, —$C_6H_5$, —$CF_2$—$CHF$—$CF_3$, and

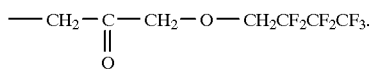

Examples of diradicals include —$(CH_2)_n$—, —$(CH_2)_n$—, —$CF_2$—and —$C_6H_4$—. Examples of triradicals include

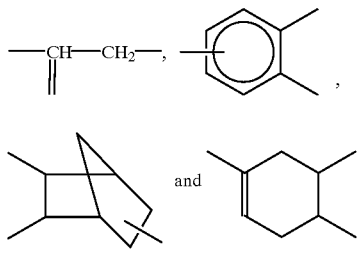

where n=1 to 10 and m is 1 to 200, but is preferably 1 to 12. (Siloxane diamines are herein denoted by the notation "$G_m$".)

POLYAMIC ACID

Generally, stoichiometric quantities of diamine and dianhydride monomers are used to obtain polyimides of the highest molecular weight, but the equivalent ratio of dianhydride to diamine can range from 1:2 to 2:1. A polyimidesiloxane can be made from about 1 to about 60 wt % siloxane-containing monomers and about 40 to about 99 wt % monomers that do not contain siloxane. Preferably, they are made from about 1 to about 30 wt % siloxane-containing monomers and about 70 to about 99 wt % monomers that do not contain siloxane.

Upon the addition of the monomers to the solvent, polymerization will occur at room temperature to form the polyamic acid. The solution is then partially imidized. This can be accomplished chemically by, for example, the addition of acetic anhydride, or by heating, preferably at about 130 to about 170° C. About 10 to about 95% of the amic acid groups are preferably imidized as if less than 10% are imidized the resolution of the pattern is poor and the viscosity of the solution is high and if more than 95% are imidized the partially imidized polyamic acid is too insoluble and the viscosity of the solution is again too high. It is preferable to imidize about 20 to about 50% of the amic acid groups. The amount of imidization that has occurred can be determined by infrared spectrum analysis, by measuring the amount of water given off in forming the imide groups or by heating to predetermined times, drying and titrating the polyamic acid to determine the relationship between the heating time and the percent imidization. The amount of heat necessary to achieve a particular percent imidization will depend upon the particular monomers used.

SECOND SOLUTION

Once the polyamic acid has been partially imidized, it can be concentrated, since the partially imidized polyamic acid is more soluble. Concentration can be accomplished by gently heating under vacuum at about 80 to about 130° C. Concentration is preferably achieved by precipitating the partially imidized polyamic acid from the first solution, preferably by the addition of water. The precipitated partially imidized polyamic acid is collected, usually by filtration, and can be washed (e.g., in methanol), and dried, if desired. It is then dissolved in a second organic solvent, preferably NMP or DNAC, to form the second solution of about 20 to about 50 wt % solids. If the second solution is less than 20 wt % solids the resulting film is too thin and if it is over 50 wt % solids the solution is too viscous to apply easily to the substrate; it is preferable to form a 30 to 40 wt % solids solution. The steps of recovering the partially imidized polyamic acid from the first solution and redissolving it in a second solvent are preferable to form a high solids solution because the first solution cannot be concentrated by evaporation of the solvent without imidizing the polyamic acid.

FORMING A PATTERN

The second solution is applied to a substrate and the solvent is evaporated by soft baking typically at 90 to 120° C., to form a coating on the substrate. Any substrate can be used, but typical substrates include silicon nitride, silicon dioxide, aluminum and copper, as well as silicon wafers. Since the monomers used in this invention do not contain photosensitive groups, it is necessary to use a photoresist or a photosensitizer in order to form a pattern. In one embodiment of this invention, a photoresist is applied over to the coating to form a layer, typically about 1 to about 3 µm thick. The photoresist is exposed to light which renders the exposed portions soluble (a positive photoresist) or insoluble (a negative photoresist) the soluble portions are washed away using a developing solvent along with the coating underneath them, the remaining insoluble photoresist is removed, typically by dissolving in another solvent, and the partially imidized polyamic acid is fully cured. A typical curing schedule is 150° C. for 30 minutes, 250° C. for 30 minutes and 350° C. for 30 minutes. The resulting layer of polyimide is typically about 3 to about 20 µm thick.

In a second embodiment of this invention, preferably about 10 to about 30 wt % based on the weight of the partially imidized precursor, of a photosensitizer or a mixture of a dissolution inhibitor and a photoactive compound is added to the high solids content second solution of partially imidized polyamic acid. Less than about 10 wt % photosensitizer or dissolution inhibitor may not be effective and more than about 30 wt % may require more ultraviolet light exposure and the quality of the pattern may deteriorate. The solution containing the photosensitizer in the partially imidized polyamic acid is applied to the substrate and the solvent is evaporated as before to form a coating. The coating is exposed to light and the exposed portions are washed away with the aqueous base developer to form the pattern on the substrate The partially imidized polyamic acid is then heated as before to fully imidize it. Photosensitizers that can be used can be found in European Patent 478321 A1 invented by M. Oba et al., p. 68–82, herein incorporated by reference. Examples of such photosensitizers include derivatives of 1,2 naphthoquinone (2)-diazido-4-sulfonate 1,2 naphthoquinone (2)-diazido-5-sulfonate and azide compounds. The following are examples of positive photosensitizers:

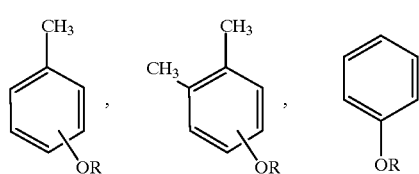

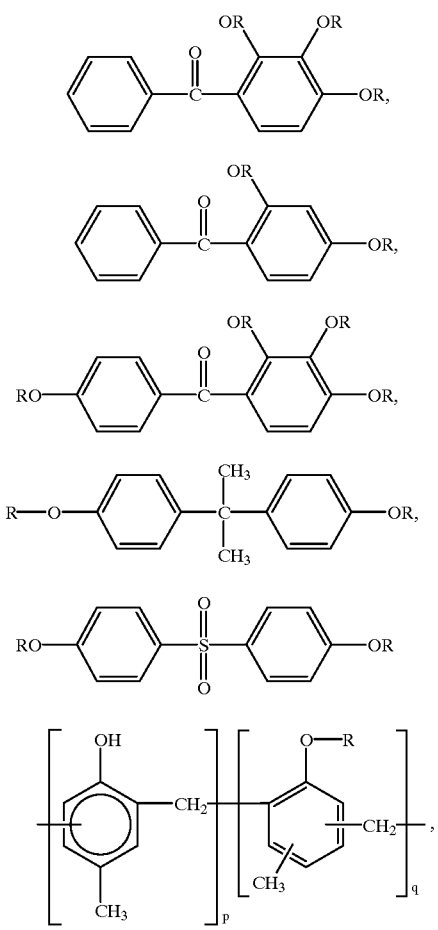

where p is 1 to 100, q is 1 to 100, and

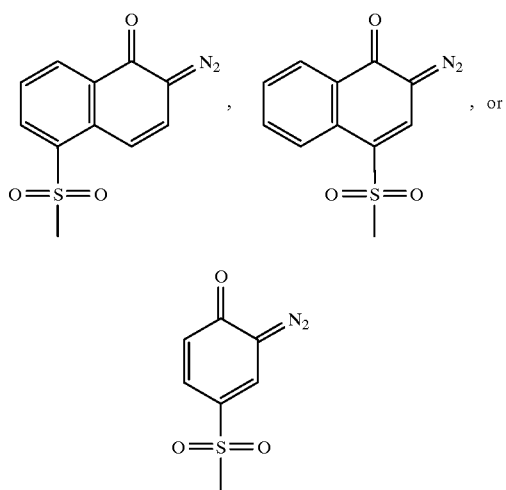

A preferred example of a positive photosensitizer is a derivative of 1,2-naphtholuinone- (2 )diazido-5-sulfonate which undergoes the following photoreaction by UV exposure:

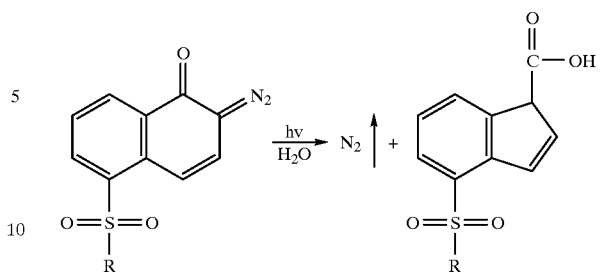

While this photosensitizer does not react with the partially imidized polyamic acid, it is initially insoluble in alkali water and its hydrophobicity prevents the partially imidized polyamic acid from dissolving in alkali water. However, when it is exposed to light it becomes soluble in the aqueous base developer and permits the dissolution of partially imidized polyamic acid with which it is in contact.

A photosensitive system of the partially imidized polyamic acid can also be prepared from dissolution inhibitors and photoactive compounds. The dissolution inhibitors contain an acid labile blocking group, such as a t-butyl ester or a t-butyl carbonate. The photoactive compounds should generate a strong acid by UV irradiation and the strong protonic acid can deblock the acid labile groups during a subsequent postbake process. A positive image can be obtained by developing with aqueous base. The dissolution inhibitors are as follows:

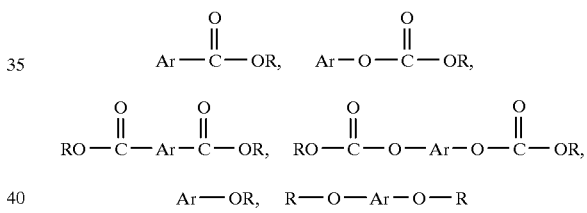

Ar=aromatic or cycloaliphatic and R=H or

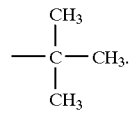

Examples of the photoactive compounds, which can produce strong acid by exposure, include derivitives of 1,2-naphthoquinone-(2)-diazide sulfonate, diaryl iodium salts, p-nitrobenzyl-9,10-diethoxyanthracene sulfonate, etc.

Examples of dissolution inhibitors includes:

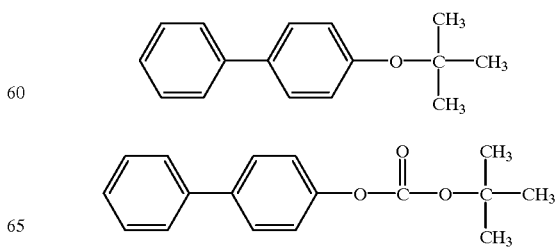

-continued

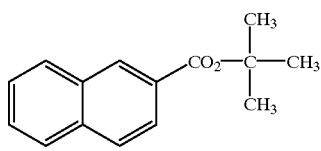

In addition to forming a pattern for insulation purposes, the coating also acts as a support to strengthen the substrate and can also act as a mask to permit the etching of the substrate.

The following examples further illustrate this invention.

EXAMPLE 1

Polyimidesiloxane

To a 500 mL 3-necked flask equipped with a mechanical stirrer, a reflux condenser and a thermometers 48.2 g (0.155 mol) of 4,4'-oxydiphthalic anhydride and 11 g of 1,3-bis(3-aminopropyl) terminated polydimethylsiloxane were dissolved in 500 mL N-methyl pyrrolidone and a reaction was run for 4 hours. Then 40.8 g (0.14 mol) of 1,3-bis(3-aminophenoxy)benzene was added and the polymerization was run for 16 hours. The viscosity of the polyamic acid, measured by Brookfield Visoometer LVT, was 246 cps. For the partial imidization, the temperature was raised to 160° C. To measure viscosity and the partial imidization by titrating the carboxylic acid group with 0.1N tetrabutyl ammonium hydroxide, samples were taken out at 3, 6 and 15 minutes during the azeotropic distillation at 160° C. The fully imidized (98.4%) sample was obtained from the same polyamic acid solution in NMP and toluene by the azeotropic distillation at 165° C. for 5 hours. The imidized solution was precipitated in water and washed with methanol. The dry resin was redissolved in NMP at 16.7% concentrations The viscosity versus the percent imidization is shown in the following table and in the accompanying drawing. A the imidization proceeded the viscosity decreased and then increased again near full imidization.

| Imidization % | 0% | 13.7% | 41.3% | 55.8% | 67% | 98.4% |
|---|---|---|---|---|---|---|
| Viscosity/cps | 246 | 30 | 22.5 | 17.5 | 19 | 251 |

The partially imidized solution was precipitated in methanol, filtrated and dried in a vacuum oven at 60° C. Samples of the dry resin having different percentages of imidization were redissolved in RMP to give solutions having a viscosity of about 250 cps. The percent imidization vs. concentration of those solutions is shown in the following table.

| Imidization % | 0 | 61 | 68 | 72.5 | 98.4 |
|---|---|---|---|---|---|
| Concentration % | 16.9 | 32.7 | 35.7 | 26.8 | 16.6 |

The table shows that a higher solid content solution could be obtained from the partially imidized resin (PIP), compared to the polyamic acid and the fully imidized polyimide.

The 65% imidized solution was precipitated in methanol and dried in a vacuum oven at 60° C. When dissolving the dry resin in H-methyl pyrrolidone, a high solid content solution (30 to 50%) was obtained.

EXAMPLE 2

Polyimide With Photoresist

To a 500 mL 3-necked flask equipped with a mechanical stirrer and a thermometer, 12 g (0.06 mol) of 4,4'-diaminodiphenyl ether and 150 mL H-methyl pyrrolidone were charged and then 13.1 g (0.06 mol) of pyromellitic dianhydride was added. The resulting solution was stirred slowly for 12 hours under nitrogen blanket. The viscosity of a 15% solids content solution was 4880 cps. For the partial imidization in solution by azeotropic distillation, 25 mL toluene was added to the polyamic acid solution and the temperature was raised to 150° C., azeotroped for 2 minutes and the reactor cooled down in an ice bath. The partially imidized polyimide precursor (PIP) was precipitated into water and washed with methanol and dried in a vacuum oven at 60° C. The molecular weight (Mn) of PIP measured by the gel permeation chromatography was 8970 g/mol and the polydispersity was 3. The imidization was 31% and the viscosity of a 25% concentration was 875 cps.

The dry PIP was dissolved in NMP at 20% solid concentration, spin-coated on a silicone wafer and soft-baked at 100° C. for 2 minutes. A positive photoresist, Shipley Microposit® 1813, was spin-coated onto the 4 $\mu$m PIP coating and soft-baked at 90° C. for 2 minutes. The 2 $\mu$m photoresist coating on the PIP was exposed to UV light through a pattern mask for 5 seconds with a source having a power of 350 watts. The exposed photoresist and PIP coatings were developed in a 0.27N tetramethylammonium hydroxide for 45 seconds and the photoresist on the PIP film was washed away in acetone. The 20 to 50 $\mu$m PIP patterns were obtained and cured at 90, 150, 250 and 350° C. for 30 minutes, respectively.

EXAMPLE 3

Polyimidesiloxane With Photoresist

A polyamic acid was prepared by reacting 6.5 g (0.03 mol) of pyromellitic dianhydride and 22.6 g (0.07 mol) of benzophenone tetracarboxylic acid anhydride with 18 g (0.09 mol) of 4,4'-oxydianiline and 2.5 g (0.01 mol) of 1,3-bis(3-aminopropyl)1,1,3,3-tetramethyldisiloxane in 280 mL N-methyl pyrrolidone. After adding 45 mL toluene to the polyamic acid, the azeotropic distillation was done at 145° C. for 3 minutes, the PIP was precipitated in water, washed with methanol and dried in a vacuum oven at 60° C. The molecular weight (Mn) was 12,480 g/mole the polydispersity was 2.4 and the imidization was 39%.

The dry PIP was dissolved in NMP at 28% concentration, spin-coated on a silicon wafer and soft-baked at 90° C. for 2 minutes. Shipley positive resist, Microposit 1813 was coated at 3000 rpm for 40 seconds on the 5 $\mu$m PIP film and soft-baked at 90° C. for 2 minutes. The 2 $\mu$m thick photoresist film was exposed to UV light through a mask for 5 seconds and developed in a 0.27 N-tetramethylammonium hydroxide for 60 seconds. After developing patterns, the photoresist was washed in acetone. When the PIP patterns were cured by baking from 90 to 350° C., the shrinkage of films was 26%, which is 8% lower than the polyamic acid.

EXAMPLE 4

Polyimidesiloxane With Photosensitizer

The PIP of Example 3 was redissolved in NHP at the 30 weight % concentration, and the photosensitizer, m-cresol 1,2-naphthoguinone (2)-diazido-4-sulfonate, was added to the PIP solution at a concentration of 30 weight % based on the PIP resin. The photosensitive solution was applied to a silicon wafer by spin-coating and soft-baked at 80° C. for 30 minutes in a convection oven. The 5.8 $\mu$m thick coating was exposed to UV light through a pattern mask for 30 seconds.

The exposed film was developed in an aqueous base developer (0.23 N-tetramethyl ammonium hydroxide) for 40 to 60 seconds and washed in water. After curing the developed film at 350° C., the 2.7 μm thick pattern was obtained.

EXAMPLE 5

Polyimide With Photosensitizer

The polyamic acid of 3,3',4,4'-biphenyl tetracarboxylic dianhydride and p-phenylene diamine (BPDA/PDA) was prepared at a 7.7% concentration in NMP. The viscosity was 5000 cps. After adding toluene to the polyamic acid, the partially imidized PIP was obtained at 150 to 155° C. for 5 minutes in the same method as described in the above examples. The imidization was 37%, the molecular weight (Mn) was 17,043 g/mol and the polydispersity was 2.3. The partially imidized BPDA/PDA was dissolved at 20% concentration in NMP and the viscosity was 465 cps. The photosensitizer, m-cresol 1,2-naphthoguinone (2)-diazido-4-sulfonate was added at the 30% concentration of the BPDA/ODA resin. The photosensitive solution was spin-coated on a silicon wafer and soft-baked on a hot plate at 130° C. for 90 seconds. The 1.9μm thick film was exposed to UV light through a pattern mask for 20 seconds The exposed film was developed in a 0.18 N-tetramethyl ammonium hydroxide for 25 seconds and washed in water. After development, the thickness of the film was 1.8 μm.

I claim:

1. A method of forming a pattern on a substrate comprising
   (A) forming a first solution which comprises
      (1) organic solvent, and
      (2) monomers of
         (a) diamine, and
         (b) dianhydride, tetracarboxylic acid or ester of tetracarboxylic acid;
   (B) polymerizing said monomers to form a polyamic acid soluble in said organic solvent;
   (C) imidizing 20 to 95% of the amic acid groups in said polyamic acid to form a partially imidized polyamic acid;
   (D) forming a second solution of said partially imidized polyamic acid, which is more concentrated than said first solution;
   (E) applying said second solution to a substrate;
   (F) evaporating the solvent from said second solution to form a coating of said partially imidized polyamic acid on said substrate;
   (G) using a process requiring exposure to light, removing a portion of said coating to form a pattern on said substrate; and
   (H) fully imidizing said partially imidized polyamic acid in said coating on said substrate.

2. A method according to claim 1 wherein said second solution is formed by heating said first solution of partially imidized polyamic acid under vacuum at about 80 to about 130° C.

3. A method according to claim 1 wherein said second solution is formed by precipitating said partially imidized polyamic acid from said first solution and forming a second solution having a solids content of 20 to 50 wt % by dissolving said partially imidized polyamic acid in an organic solvent.

4. A method according to claim 1 wherein said pattern is formed by applying a layer of a photoresist over said coating, exposing portions of said layer of photoresist to light whereby exposed or unexposed portions are rendered soluble in a developing solvent while unexposed or exposed portions, respectively, remain insoluble in said developing solvent, and washing away a soluble portions of said photoresist and the coating beneath it with said developing solvent.

5. A method according to claim 1 wherein said pattern is formed by including a photosensitizer or a mixture of a dissolution inhibitor and a photoactive compound in said second solution, exposing a portion of said coating to light, whereby exposed portions are rendered soluble in a developing solvent while unexposed portions are insoluble, and washing away said soluble portions with said developing solvent.

6. A method according to claim 1 wherein said partially imidized polyamic acid is about 20 to about 50% imidized.

7. A method according to claim 1 wherein said diamine is a mixture of aromatic diamine that does not contain siloxane groups and aliphatic diamine that contains siloxane groups.

8. A method according to claim 1 wherein said substrate is a silicon wafer.

9. A method according to claim 1 wherein said partially imidized polyamic acid contains no photosensitive groups.

10. A method according to claim 1 wherein said dianhydride is selected from the group consisting of pyromellitic dianhydride, 3,3',4,4'-benzophenone tetracarboxylic dianhydride, 3,3',4,4'-biphenyl tetracarboxylic dianhydride, bis(3,4-dicarboxyphenyl) ether dianhydridee and 2,2-bis(3,4-dicarboxyphenyl)hexafluoropropane dianhydride.

11. A method according to claim 1 wherein said diamine is selected from the group consisting of 4,4'-oxydianiline, p-phenylene diaminea and m-phenylene diamine.

12. A method of forming a polyimidesiloxane pattern on a substrate comprising
   (A) forming a first solution of about 5 to about 20 wt % solids in an organic solvent of approximately equal molar amounts of diamine and dianhydride or dianhydride equivalent, where said diamine is about 40 to about 99% non-siloxane containing diamine and about 1 to about 60% siloxane containing diamine;
   (B) heating said first solution to about 130 to about 170° C. to form a polyamic acid that is 20 to 50% imidized;
   (C) forming a second solution of said polyamic acid which is more concentrated than said first solution;
   (D) applying said second solution to a substrate;
   (E) evaporating the solvent from said second solution to form a coating on said substrate;
   (F) applying a photoresist to said coating;
   (G) exposing said photoresist to a pattern of light, whereby exposed portions of said photoresist are rendered soluble or insoluble while unexposed portions remain insoluble or soluble, respectively;
   (H) dissolving the soluble portions of said photoresist and of the coating underneath in a solvent; and
   (I) fully imidizing said partially imidized polyamic acid in said coating on said substrate.

13. A method according to claim 12 wherein said partially imidized polyamic acid is about 20 to about 50% imidized.

14. A method according to claim 12 wherein said second solution is formed by adding water to said first solution to precipitate said polyamic acid and dissolving said polyamic acid in an organic solvent to form a solution of about 20 to about 50 wt % solids.

15. A method according to claim 12 wherein said substrate is a silicon wafer.

16. A method of forming a polyimidesiloxane pattern on a substrate comprising
- (A) forming a first solution of about 5 to about 20 wt % solids in an organic solvent of approximately equal molar amounts of diamine and dianhydride or dianhydride equivalent, where said diamine is about 40 to about 99% non-siloxane containing diamine and about 1 to about 60% siloxane containing diamine;
- (B) heating said first solution to about 130 to about 170° C. to form a polyamic acid that is 20 to 50% imidized;
- (C) forming a second solution of said polyamic acid, which is more concentrated than said first solution;
- (D) adding to said second solution about 10 to about 30 wt % of a photosensitizer or a mixture of a dissolution inhibitor and a photoactive compound, based on the weight of said polyamic acid, where said photosensitizer or mixture of a dissolution inhibitor and a photoactive compound renders said polyamic acid less soluble in a dissolving solvent unless said photosensitizer has been exposed to light;
- (E) applying said second solution to a substrate;
- (F) evaporating the solvent from said second solution to form a coating on said substrate;
- (G) exposing said coating to a pattern of light;
- (H) washing said coating with said dissolving solvent, whereby portions of said coating that were exposed to light dissolve in said dissolving solvent and portions of said coating that were not exposed to light do not dissolve in said dissolving solvent; and
- (I) fully imidizing said partially imidized polyamic acid in said coating on said substrate.

17. A method according to claim 16 wherein said more concentrated solution is formed by adding water to said first solution to precipitate said polyamic acid and dissolving said polyamic acid in an organic solvent to form a second solution of about 20 to about 50 wt % solids.

18. A method according to claim 16 wherein said dissolving solvent is an aqueous base developer.

19. A method according to claim 16 wherein said substrate is a silicon wafer.

20. A method according to claim 16 wherein said partially imidized polyamic acid is about 20 to about 50% imidized.

* * * * *